(12) United States Patent
Takao et al.

(10) Patent No.: US 8,854,117 B2
(45) Date of Patent: Oct. 7, 2014

(54) SEMICONDUCTOR DEVICE

(71) Applicant: Kabushiki Kaisha Toshiba, Tokyo (JP)

(72) Inventors: Kazuto Takao, Ibaraki-ken (JP); Hiroshi Kono, Hyogo-ken (JP); Takuo Kikuchi, Kanagawa-ken (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 0 days.

(21) Appl. No.: 13/792,387

(22) Filed: Mar. 11, 2013

(65) Prior Publication Data
US 2014/0084993 A1    Mar. 27, 2014

(30) Foreign Application Priority Data

Sep. 24, 2012    (JP) ................................ 2012-210188

(51) Int. Cl.
*H03K 3/01*    (2006.01)
*G05F 3/20*    (2006.01)

(52) U.S. Cl.
CPC ........................................ *G05F 3/20* (2013.01)
USPC .......................................... 327/534; 327/379

(58) Field of Classification Search
None
See application file for complete search history.

(56) References Cited

U.S. PATENT DOCUMENTS 6,943,445 B2 *   9/2005   Shirakawa et al. ............ 257/724
8,248,042 B2 *   8/2012   Morita ........................... 323/222

FOREIGN PATENT DOCUMENTS

| JP | 11-155286   | 6/1999  |
| JP | 2001-274322 | 10/2001 |
| JP | 2005-5593   | 1/2005  |
| JP | 2007-234690 | 9/2007  |

* cited by examiner

*Primary Examiner* — Cassandra Cox
(74) *Attorney, Agent, or Firm* — Oblon, Spivak, McClelland, Maier & Neustadt, L.L.P.

(57) ABSTRACT

According to one embodiment, a semiconductor device includes: a substrate; a first circuit portion; and a second circuit portion. The first circuit portion includes: a first and a second switching elements, and a first and a second diodes. The second circuit portion includes a third and a fourth switching elements, and a third and a fourth diodes. The first switching element is juxtaposed with the second switching element in a first direction, and is juxtaposed with the fourth switching element in a second direction. The third switching element is juxtaposed with the fourth switching element in the first direction, and is juxtaposed with the second switching element in the second direction. A voltage is applied to electrodes of the first and third switching elements. A voltage of a polarity opposite the first voltage is applied to electrodes of the second and fourth switching elements.

20 Claims, 14 Drawing Sheets

US 8,854,117 B2

SEMICONDUCTOR DEVICE

CROSS-REFERENCE TO RELATED APPLICATIONS

This application is based upon and claims the benefit of priority from the prior Japanese Patent Application No. 2012-210188, filed on Sep. 24, 2012; the entire contents of which are incorporated herein by reference.

FIELD

Embodiments described herein relate generally to a semiconductor device.

BACKGROUND

The interconnection of semiconductor devices has parasitic inductance, and when a semiconductor element is switching, an induced voltage is generated represented by the integral of the parasitic inductance and the current changing rate during switching (di/dt). Therefore, a direct current voltage of a power converter circuit and the induced voltage are applied to the semiconductor element. When a large voltage that is the sum of the direct current voltage and the induced voltage applied to the semiconductor element exceeds the breakdown voltage of the semiconductor element, there is a possibility of breakdown of the semiconductor element. In semiconductor devices, it is important to minimize parasitic inductance as much as possible in order to increase the reliability.

BRIEF DESCRIPTION OF THE DRAWINGS

FIG. 12A illustrates a schematic cross-sectional view at a
FIGS. 13A and 13B are schematic views illustrating the second embodiment.

DETAILED DESCRIPTION

Figure 1:
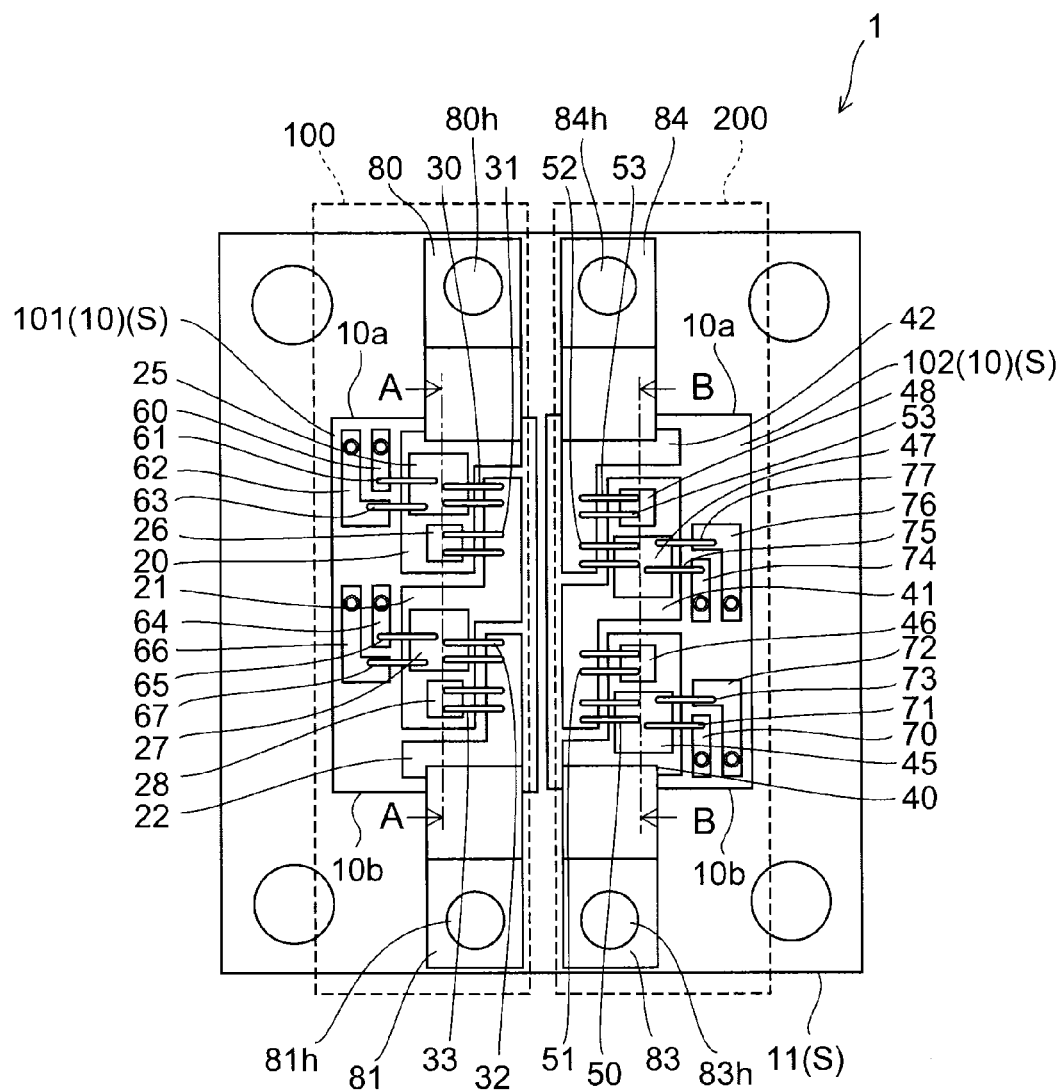
FIG. 1 is a schematic plan view of a semiconductor device according to a first embodiment.

In general, according to one embodiment, a semiconductor device includes: a substrate; a first circuit portion provided on the substrate, the first circuit portion including: a first switching element including a first electrode and a second electrode, a first diode including a first cathode electrode connected to the first electrode and a first anode electrode connected to the second electrode, a second switching element including a third electrode connected to the second electrode and a fourth electrode, and a second diode including a second cathode electrode connected to the third electrode and a second anode electrode connected to the fourth electrode; and a second circuit portion provided on the substrate, the second circuit portion including a third switching element including a fifth electrode and a sixth electrode, a third diode including a third cathode electrode connected to the fifth electrode and a third anode electrode connected to the sixth electrode, a fourth switching element including a seventh electrode connected to the sixth electrode and an eighth electrode, and a fourth diode including a fourth cathode electrode connected to the seventh electrode and a fourth anode electrode connected to the eighth electrode. The first switching element is juxtaposed with the second switching element in a first direction along the substrate, and is juxtaposed with the fourth switching element in a second direction that intersects with the first direction along the substrate. The third switching element is juxtaposed with the fourth switching element in the first direction, and is juxtaposed with the second switching element in the second direction. A voltage of a first polarity is applied to the first electrode and the fifth electrode. A voltage of a second polarity opposite the first polarity is applied to the fourth electrode and the eighth electrode.

In general, according to another embodiment, a semiconductor device includes: a substrate; a first circuit portion provided on the substrate, the first circuit portion including: a first switching element including a first electrode and a second electrode, a first diode including a first cathode electrode connected to the first electrode and a first anode electrode connected to the second electrode, a second switching element including a third electrode connected to the second electrode and a fourth electrode, and a second diode including a second cathode electrode connected to the third electrode and a second anode electrode connected to the fourth electrode; and a second circuit portion provided on the substrate, the second circuit portion including a third switching element including a fifth electrode and a sixth electrode, a third diode including a third cathode electrode connected to the fifth electrode and a third anode electrode connected to the sixth electrode, a fourth switching element including a seventh electrode connected to the sixth electrode and an eighth electrode, and a fourth diode including a fourth cathode electrode connected to the seventh electrode and a fourth anode electrode connected to the eighth electrode. The first switching element is juxtaposed with the third switching element in a first direction along the substrate, and is juxtaposed with the fourth switching element in a second direction that intersects with the first direction along the substrate. The second switching element is juxtaposed with the fourth switching element in the first direction, and is juxtaposed with the third switching element in the second direction. A voltage of a first polarity is applied to the first electrode and the fifth electrode. A voltage of a second polarity opposite the first polarity is applied to the fourth electrode and the eighth electrode.

Hereinafter, embodiments will be described below with reference to the drawings. In the following description, the same reference numeral is applied to the same member, and for members that have been described once, the description is omitted as appropriate.

First Embodiment

FIG. 1 is a schematic plan view of a semiconductor device according to a first embodiment.

Figure 2:
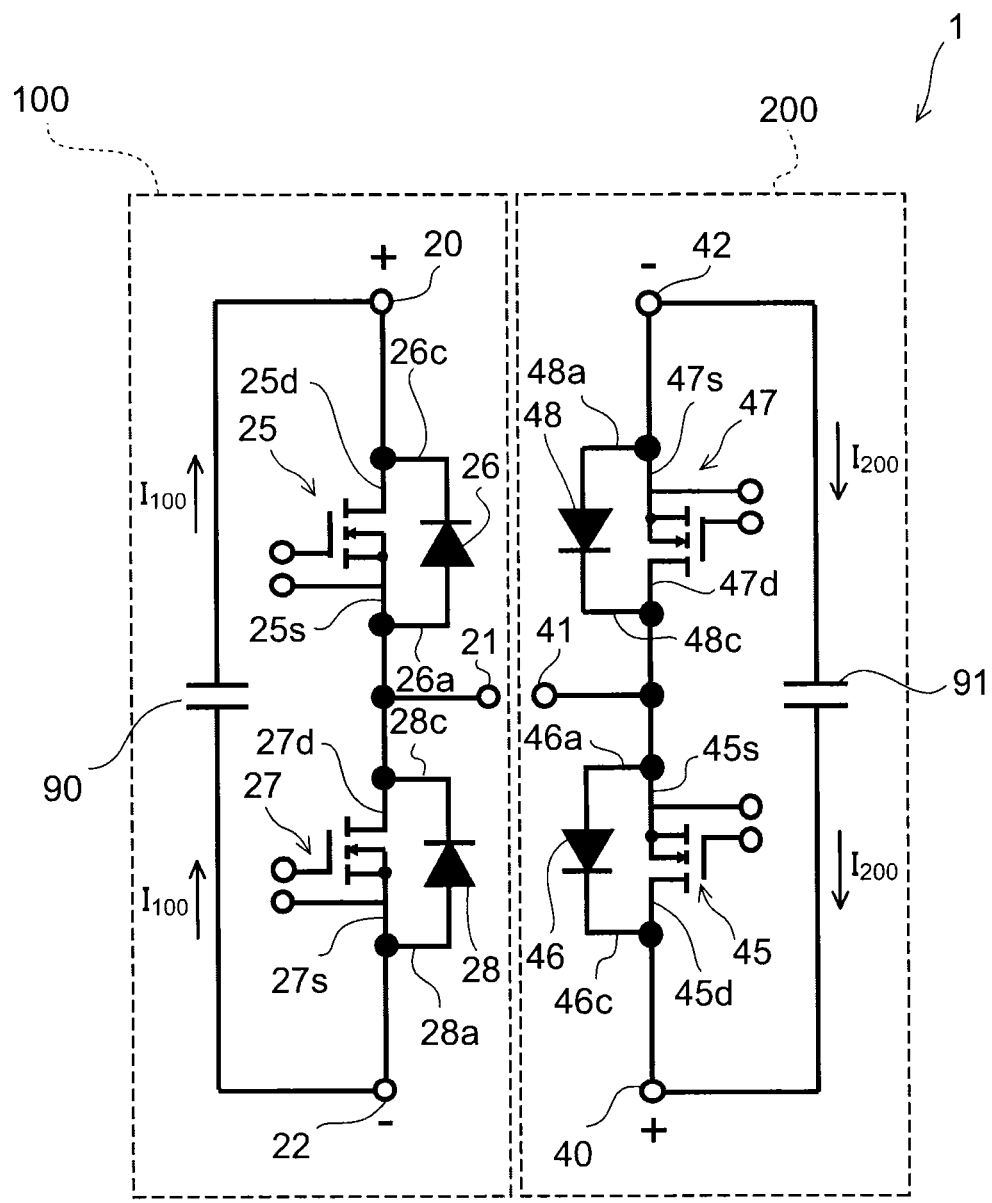
FIG. 2 is an equivalent circuit of the semiconductor device according to the first embodiment.

FIG. 2 is an equivalent circuit of the semiconductor device according to the first embodiment.

Figure 3:
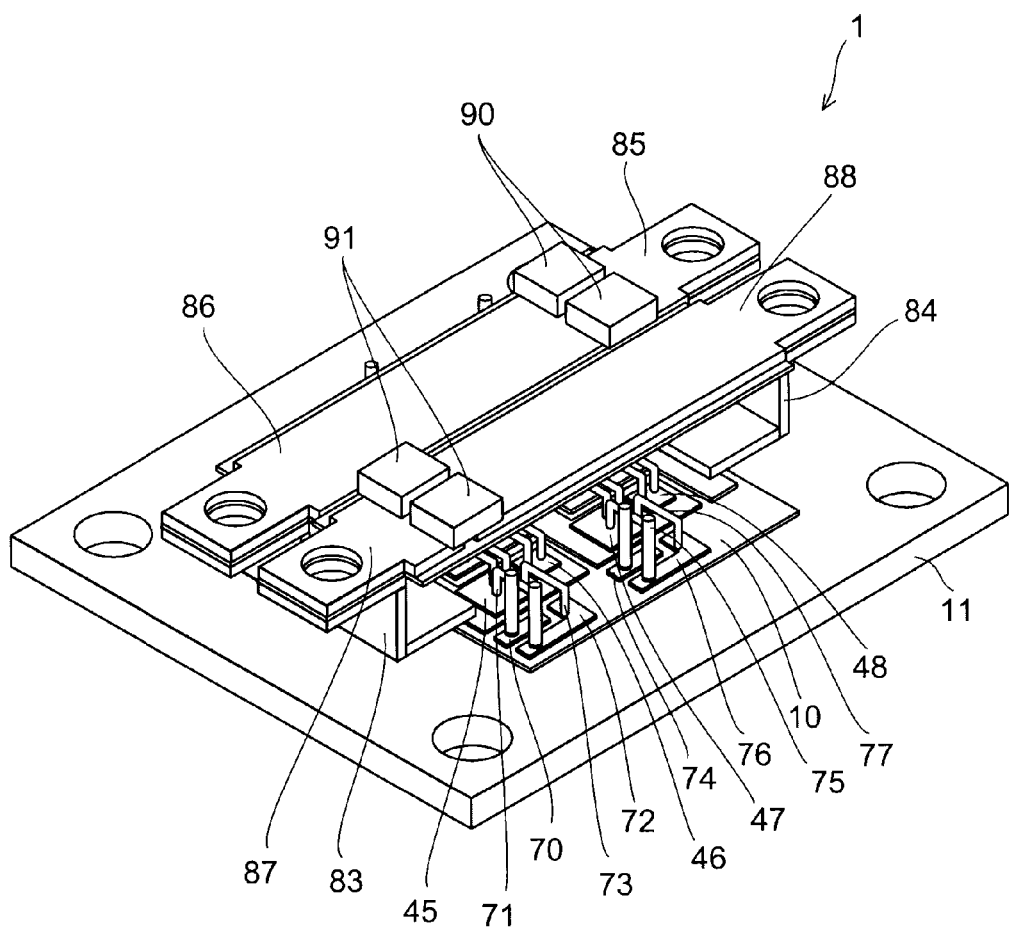
FIGS. 3 and 4 are schematic perspective views of the semiconductor device according to the first embodiment.
Figure 4:
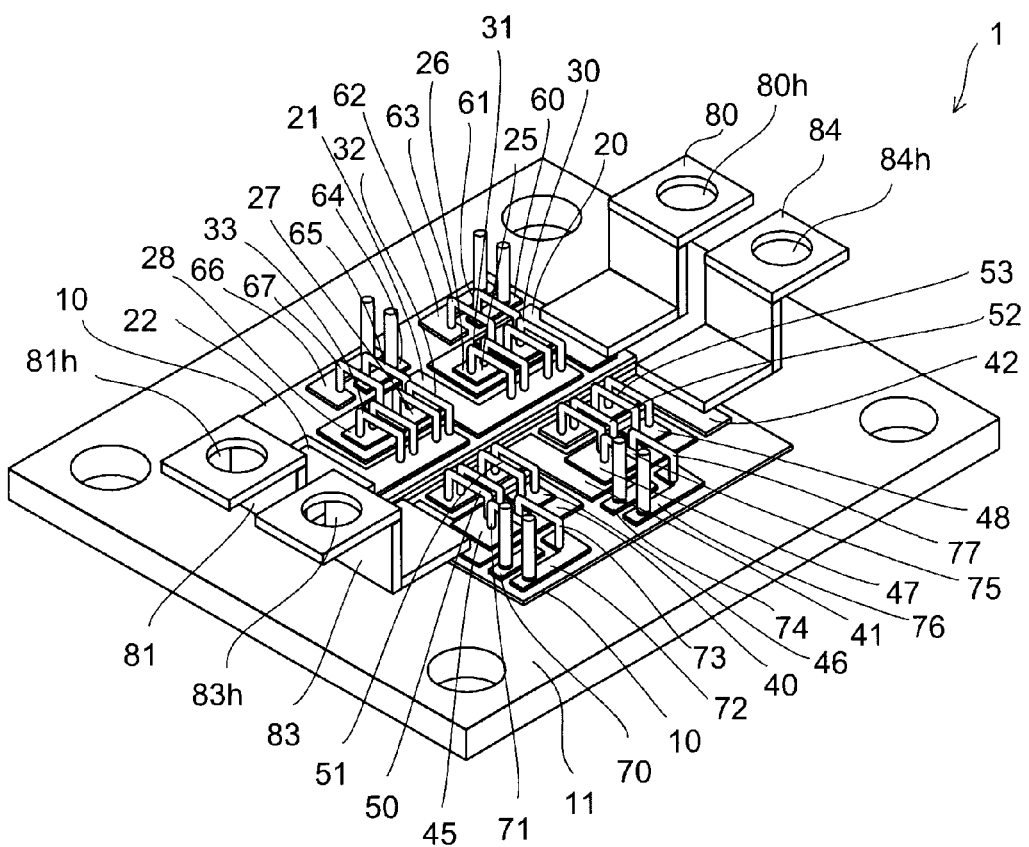

FIGS. 3 and 4 are schematic perspective views of the semiconductor device according to the first embodiment.

FIG. 5 is a schematic cross-sectional view of the semiconductor device according to the first embodiment.

Figure 5A:
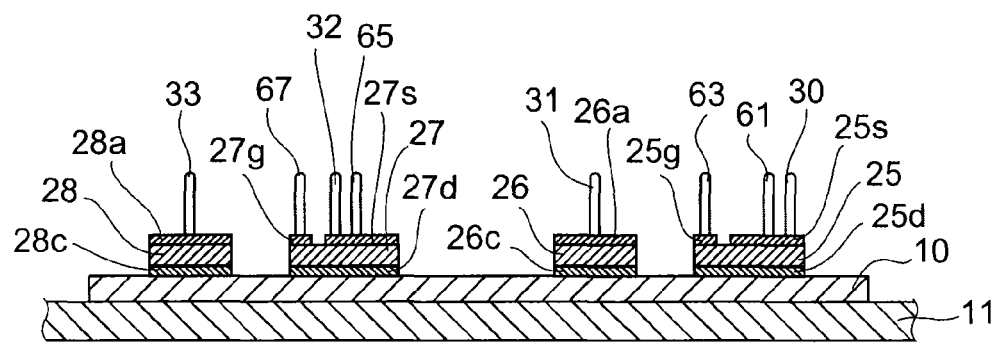
FIGS. 5A and 5B are schematic cross-sectional views of the semiconductor device according to the first embodiment.
Figure 5B:
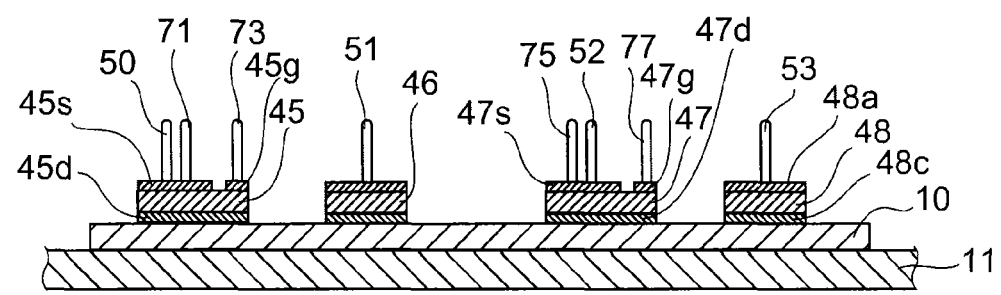

FIG. 5A is a schematic cross-sectional view at the position along the line A-A in FIG. 1. FIG. 5B is a schematic cross-sectional view at the position along the line B-B in FIG. 1.

In FIGS. 1, 2, and 4, flat conductors 85 to 88, and condensers 90, 91 illustrated in FIG. 3 are not illustrated.

A semiconductor device 1 according to a first embodiment includes, as an example, an inverter circuit. The semiconductor device 1 includes a substrate S, a first circuit portion 100 provided on the substrate S, and a second circuit portion 200 provided on the substrate S. The substrate S includes a base body 11, and an insulating substrate 10 provided on the base body 11.

The insulating substrate 10 includes a first insulating substrate 101, and a second insulating substrate 102. The first insulating substrate 101 is juxtaposed with the second insulating substrate 102 on the base body 11. In this embodiment, for convenience of description, the insulating substrate 10 refers to the whole region of the first insulating substrate 101 and the second insulating substrate 102. The first circuit portion 100 is provided on the first insulating substrate 101. The second circuit portion 200 is provided on the second insulating substrate 102. The plan shape of the insulating substrate 10 is, for example, rectangular. One of the four edges of the insulating substrate 10 is an edge 10a, and an edge opposite the edge 10a is an edge 10b.

The first circuit portion 100 includes an interconnection pattern 20 (first conductor), an interconnection pattern 21 (second conductor), an interconnection pattern 22 (third conductor), a switching element 25 (first switching element) provided on the interconnection pattern 20, a diode 26 (first diode) provided on the interconnection pattern 20, a switching element 27 (second switching element) provided on the interconnection pattern 21, and a diode 28 (second diode) provided on the interconnection pattern 21.

The interconnection pattern 21 is disposed adjacent to the interconnection pattern 20. The interconnection pattern 22 is disposed adjacent to the interconnection pattern 21. The interconnection pattern 20, the interconnection pattern 21, and the interconnection pattern 22 are provided separated from each other.

As illustrated in FIG. 2 and FIG. 5A, the switching element 25 includes a drain electrode 25d (first electrode) and a source electrode 25s (second electrode). The drain electrode 25d is connected to the interconnection pattern 20.

Interconnection patterns 60, 62, 64, and 66 are provided on the insulating substrate 10.

The source electrode 25s of the switching element 25 is electrically connected to the interconnection pattern 60 via a source interconnection 61. A gate electrode 25g of the switching element 25 is electrically connected to the interconnection pattern 62 via a gate interconnection 63.

A source electrode 27s of the switching element 27 is electrically connected to the interconnection pattern 64 via a source interconnection 65. A gate electrode 27g of the switching element 27 is electrically connected to the interconnection pattern 66 via a gate interconnection 67.

The diode 26 includes a cathode electrode 26c (first cathode electrode) and an anode electrode 26a (first anode electrode). The cathode electrode 26c is connected to the interconnection pattern 20.

The switching element 27 includes a drain electrode 27d (third electrode) and the source electrode 27s (fourth electrode). The drain electrode 27d is connected to the interconnection pattern 21.

The diode 28 includes a cathode electrode 28c (second cathode electrode) and an anode electrode 28a (second anode electrode). The cathode electrode 28c is connected to the interconnection pattern 21.

In the semiconductor device 1, the source electrode 25s of the switching element 25 is electrically connected to the interconnection pattern 21 via an interconnection 30 (first interconnection). The anode electrode 26a of the diode 26 is electrically connected to the interconnection pattern 21 via an interconnection 31 (second interconnection). The source electrode 27s of the switching element 27 is electrically connected to the interconnection pattern 22 via an interconnection 32 (third interconnection). The anode electrode 28a of the diode 28 is electrically connected to the interconnection pattern 22 via an interconnection 33 (fourth interconnection).

The second circuit portion 200 includes an interconnection pattern 40 (fourth conductor), an interconnection pattern 41 (fifth conductor), an interconnection pattern 42 (sixth conductor), a switching element 45 (third switching element) provided on the interconnection pattern 40, a diode 46 (third diode) provided on the interconnection pattern 40, a switching element 47 (fourth switching element) provided on the interconnection pattern 41, and a diode 48 (fourth diode) provided on the interconnection pattern 41.

The interconnection pattern 41 is disposed adjacent to the interconnection pattern 40. The interconnection pattern 42 is disposed adjacent to the interconnection pattern 41. The interconnection pattern 40, the interconnection pattern 41, and the interconnection pattern 42 are provided separated from each other.

As illustrated in FIG. 2 and FIG. 5B, the switching element 45 includes a drain electrode 45d (fifth electrode) and a source electrode 45s (sixth electrode). The drain electrode 45d is connected to the interconnection pattern 40.

The diode 46 includes a cathode electrode 46c (third cathode electrode) and an anode electrode 46a (third anode electrode). The cathode electrode 46c is connected to the interconnection pattern 40.

The switching element 47 includes a drain electrode 47d (seventh electrode) and a source electrode 47s (eighth electrode). The drain electrode 47d is connected to the interconnection pattern 41.

The diode 48 includes a cathode electrode 48c (fourth cathode electrode) and an anode electrode 48a (fourth anode electrode). The cathode electrode 48c is connected to the interconnection pattern 41.

Interconnection patterns 70, 72, 74, and 76 are provided on the insulating substrate 10.

The source electrode 45s of the switching element 45 is electrically connected to the interconnection pattern 70 via a source interconnection 71. A gate electrode 45g of the switching element 45 is electrically connected to the interconnection pattern 72 via a gate interconnection 73.

The source electrode 47s of the switching element 47 is electrically connected to the interconnection pattern 74 via a source interconnection 75. A gate electrode 47g of the switching element 47 is electrically connected to the interconnection pattern 76 via a gate interconnection 77.

In the semiconductor device 1, the source electrode 45s of the switching element 45 is electrically connected to the interconnection pattern 41 via an interconnection 50 (fifth interconnection). The anode electrode 46a of the diode 46 is electrically connected to the interconnection pattern 41 via an interconnection 51 (sixth interconnection). The source electrode 47s of the switching element 47 is electrically connected to the interconnection pattern 42 via an interconnection 52 (seventh interconnection). The anode electrode 48a of the diode 48 is electrically connected to the interconnection pattern 42 via an interconnection 53 (eighth interconnection).

The switching elements 25, 27, 45, and 47 are, for example, metal-oxide-semiconductor field-effect transistors (MOSFETs) or insulated gate bipolar transistors (IGBTs) with a vertical electrode structure. The diodes 26, 28, 46, and 48 are, for example, free wheeling diodes (FWDs) with a vertical electrode structure.

The switching element 25 is disposed on the edge 10a side of the insulating substrate 10, and the switching element 27 is disposed on the edge 10b side of the insulating substrate 10. The switching element 45 is disposed on the edge 10b side of the insulating substrate 10, and the switching element 47 is disposed on the edge 10a side of the insulating substrate 10.

The diode 26 is disposed on the edge 10a side of the insulating substrate 10, and the diode 28 is disposed on the edge 10b side opposite the edge 10a of the insulating substrate 10. The switching element 45 is disposed on the edge 10b side of the insulating substrate 10, and the switching element 47 is disposed on the edge 10a side of the insulating substrate 10.

In the semiconductor device 1, the switching element 25 is aligned with the switching element 27 in a first direction along the substrate S. The switching element 25 is aligned with the switching element 47 in a second direction that intersects with the first direction along the substrate S. The switching element 45 is aligned with the switching element 47 in the first direction. The switching element 45 is aligned with the switching element 27 in the second direction.

In the semiconductor device 1, a gap between the switching element 25 and the switching element 27 is substantially equal to a gap between the switching element 45 and the switching element 47. Also, a gap between the switching element 25 and the switching element 47 is substantially equal to a gap between the switching element 27 and the switching element 45.

In the semiconductor device 1, a direction from the center of the switching element 25 toward the center of the switching element 27 is opposite a direction from the center of the switching element 45 toward the center of the switching element 47. The arrangement of the switching elements, diodes, and interconnection patterns on the first insulating substrate 101 in the first circuit portion 100 is rotated 180° relative to the arrangement of the switching elements, diodes, and interconnection patterns on the second insulating substrate 102 in the second circuit portion 200. The arrangement of the switching elements, diodes, and interconnection patterns on the insulating substrate 10 is point symmetrical with the center of the base body 11 as the standard.

In other words, a line connecting the center of the switching element 25 and the center of the switching element 45, and a line connecting the center of the switching element 27 and the center of the switching element 47 intersect on the insulating substrate 10.

At least one of the switching elements 25, 27, 45, and 47 is, for example, a transistor provided on a silicon carbide substrate.

Also, the first circuit portion 100 includes a terminal 80 (first terminal) connected to the interconnection pattern 20, and a terminal 81 (second terminal) connected to the interconnection pattern 22. The first circuit portion 100 includes a flat conductor 85 (first flat conductor) connected to the terminal 80, and a flat conductor 86 (second flat conductor) connected to the terminal 81. The flat conductor 85 is electrically isolated from the flat conductor 86. The terminal 80 is disposed on the edge 10a side of the insulating substrate 10. The terminal 81 is disposed on the edge 10b side of the insulating substrate 10.

The second circuit portion 200 includes a terminal 83 (third terminal) connected to the interconnection pattern 40, and a terminal 84 (fourth terminal) connected to the interconnection pattern 42. The second circuit portion 200 includes a flat conductor 87 (third flat conductor) connected to the terminal 83, and a flat conductor 88 (fourth flat conductor) connected to the terminal 84. The flat conductor 87 is electrically isolated from the flat conductor 88. The terminal 83 is disposed on the edge 10b side of the insulating substrate 10, and the terminal 84 is disposed on the edge 10a side of the insulating substrate 10.

The flat conductor 85 is juxtaposed with the flat conductor 88 on the base body 11. The flat conductor 86 is juxtaposed with the flat conductor 87 on the base body 11. A condenser 90 (first condenser) is connected between the flat conductor 85 and the flat conductor 86. The flat conductor 87 and the flat conductor 88 are connected via a condenser 91 (second condenser).

In other words, in the first circuit portion 100, an interconnection line that includes the flat conductor 85, the condenser 90, and the flat conductor 86 is juxtaposed with an interconnection line that includes the flat conductor 87, the condenser 91, and the flat conductor 88, on the base body 11.

In the semiconductor device 1, the first circuit portion 100 is juxtaposed with the second circuit portion 200 on the base body 11. Also, in the semiconductor device 1, for example, a positive voltage (voltage of a first polarity) is applied to the interconnection pattern 20 and the interconnection pattern 40. For example, a negative voltage (voltage of a second polarity) is applied to the interconnection pattern 22 and the interconnection pattern 42.

In the semiconductor device 1, the base body 11, the first circuit portion 100 and the second circuit portion 200 may be surrounded by a resin case (not illustrated on the drawings). In this case, a portion of the terminal 80 in which a through hole 80h is provided, a portion of the terminal 81 in which a through hole 81h is provided, a portion of the terminal 83 in which a through hole 83h is provided, and a portion of the terminal 84 in which a through hole 84h is provided are exposed from the resin case. External wiring may be screwed to the semiconductor device 1 using the through holes 80h to 84h (not illustrated on the drawings).

Next, the operation of the semiconductor device 1 is described.

In the semiconductor device 1, when a positive voltage is applied to the terminals 80, 83 and a negative voltage is applied to the terminals 81, 84 from external wiring, a positive voltage is applied to the interconnection pattern 20 and the interconnection pattern 40, and a negative voltage is applied to the interconnection pattern 22 and the interconnection pattern 42. Then, as a result of the operation of the switching elements 25, 27, 45, and 47, an alternating current voltage is generated between the interconnection pattern 21 and the interconnection pattern 41. In other words, the terminals 80, 83, and the terminals 81, 84 are direct current voltage input terminals, and, in contrast, the interconnection patterns 21, 41 are alternating current voltage output terminals.

When these positive and negative voltages are applied to the semiconductor device 1, the direction of at least a portion of the current $I_{100}$ flowing in the circuit of the first circuit portion 100 is opposite the direction of at least a portion of the current $I_{200}$ flowing in the circuit of the second circuit portion

200 (FIG. 2). In other words, in the adjacent first circuit portion 100 and the second circuit portion 200, the direction of the current flowing in their respective circuits is opposite each other.

In other words, the direction of the current flowing in a first path of the terminal 80→the interconnection pattern 20→the switching element 25→the interconnection 30→the interconnection pattern 21→the switching element 27→the interconnection 32→the interconnection pattern 22→the terminal 81 is different from the direction of the current flowing in a second path of the terminal 83→the interconnection pattern 40→the switching element 45→the interconnection 50→the interconnection pattern 41→the switching element 47→the interconnection 52→the interconnection pattern 42→the terminal 84.

For example, the direction of the current flowing in the terminal 80 is opposite the direction of the current flowing in the terminal 83. The direction of the current flowing in the interconnection pattern 20 is opposite the direction of the current flowing in the interconnection pattern 40. The direction of the current flowing in the interconnection 30 is opposite the direction of the current flowing in the interconnection 50. The direction of the current flowing in the interconnection pattern 21 is opposite the direction of the current flowing in the interconnection pattern 41. The direction of the current flowing in the interconnection 32 is opposite the direction of the current flowing in the interconnection 52. The direction of the current flowing in the interconnection pattern 22 is opposite the direction of the current flowing in the interconnection pattern 42. The direction of the current flowing in the terminal 81 is opposite the direction of the current flowing in the terminal 84.

Also, the direction of current flowing in a path of the flat conductor 85→the condenser 90→the flat conductor 86 is opposite the direction of the current flowing in a path of the flat conductor 87→the condenser 91→the flat conductor 88.

Therefore, the direction of the magnetic flux generated in the first circuit portion 100 is opposite the direction of the magnetic flux generated in the second circuit portion 200. In this way, the magnetic flux generated in the first circuit portion 100 and the magnetic flux generated in the second circuit portion 200 act to cancel each other out.

Also, in the semiconductor device 1, a structural body that includes the flat conductor 85, the condenser 90, and the flat conductor 86 is juxtaposed with a structural body that includes the flat conductor 87, the condenser 91, and the flat conductor 88, on the base body 11. The directions of the magnetic fluxes generated in these structural bodies are opposite each other. Therefore, the magnetic fluxes generated in these structural bodies act to effectively cancel each other out.

In this way, the parasitic inductance within the semiconductor device 1 is reduced. Therefore, the induced voltages generated within the semiconductor device 1 are reduced. In addition, it becomes difficult to apply a voltage to the elements, such as the switching elements, the diodes and the like, that exceeds their breakdown voltage. As a result, it is difficult for breakdown of an element to occur in the semiconductor device 1. Also, in the semiconductor device 1, the current flowing within the first circuit portion 100 and the current flowing within the second circuit portion 200 in the semiconductor device 1 are proportional to each other.

Also, in the semiconductor device 1, the first circuit portion 100 and the second circuit portion 200 are provided on the insulating substrate 10. Therefore, there is no current flowing on the reverse side of the insulating substrate 10 (the surface on which circuits are not provided).

In this way, in the semiconductor device 1, parasitic inductances are reduced, the current flowing between circuit portions are in equilibrium, and a highly reliable semiconductor device is achieved.

(First Variation of the First Embodiment)

FIG. 6 is a schematic view of a first variation of the first embodiment.

Figure 6A:
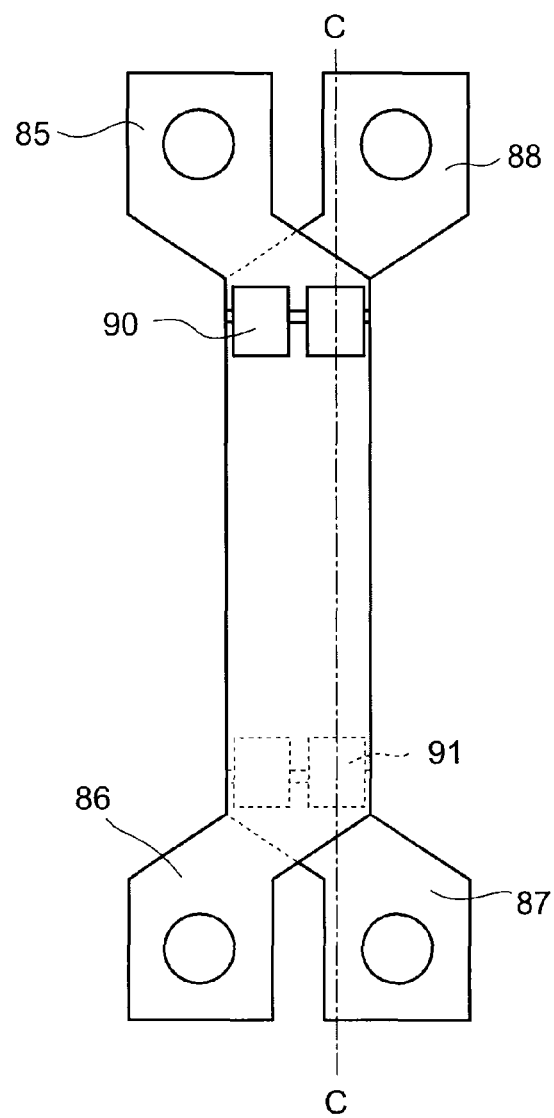
FIGS. 6A and 6B are schematic views of a first variation of the first embodiment.
Figure 6B:
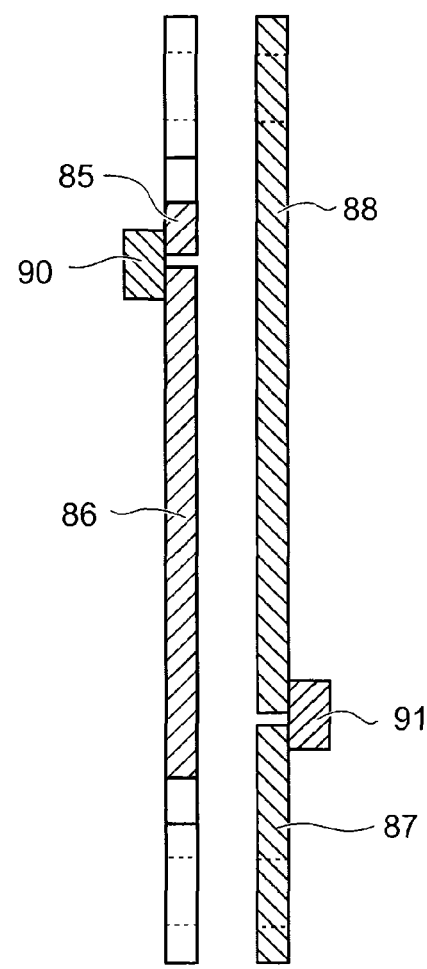

FIG. 6A illustrates a schematic plan view of a flat conductor. FIG. 6B illustrates a schematic cross-sectional view at a position along the line C-C in FIG. 6A.

In the first variation of the first embodiment, when the flat conductors are viewed from a direction normal to the top surface of the insulating substrate 10, a portion of the flat conductor 85 and a portion of the flat conductor 88 are overlapped. Also, when the flat conductors are viewed from a direction normal to the top surface of the insulating substrate 10, a portion of the flat conductor 86 and a portion of the flat conductor 87 are overlapped. In other words, a portion of the plane of the structural body that includes the flat conductor 85, the condenser 90, and the flat conductor 86, and a portion of the plane of the structural body that includes the flat conductor 87, the condenser 91, and the flat conductor 88 overlap each other.

In this way, the magnetic flux generated in these structural bodies is more efficiently canceled out. In this way, the parasitic inductance within the semiconductor device 1 is further reduced. As a result, a more highly reliable semiconductor device is achieved.

(Second Variation of the First Embodiment)

Figure 7:
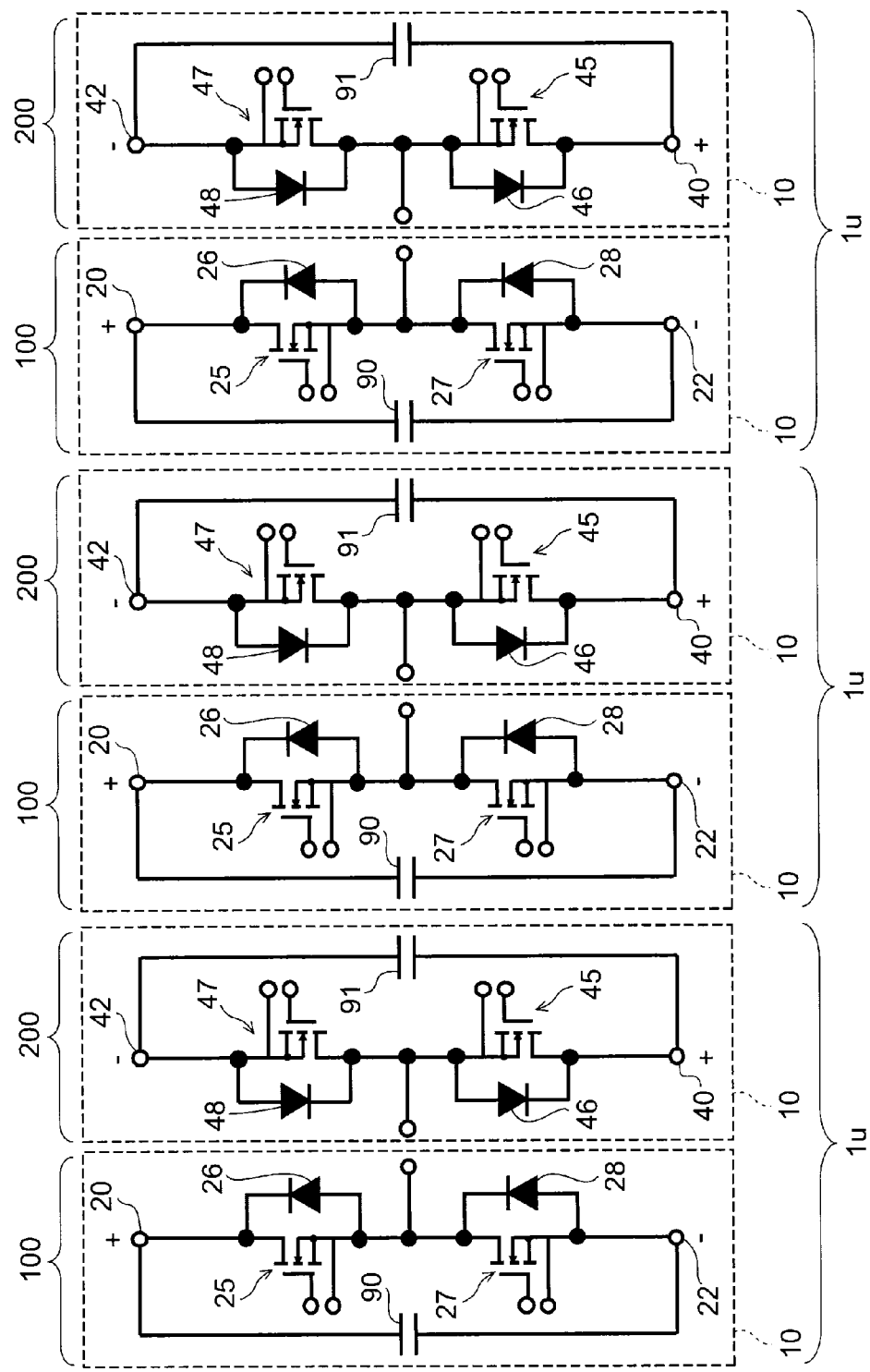
FIG. 7 is an equivalent circuit diagram of a second variation of the first embodiment.

FIG. 7 is an equivalent circuit diagram of the second variation of the first embodiment.

The number of first circuit portions 100 and the number of second circuit portions 200 are not necessarily limited to one each. In the second variation of the first embodiment, the semiconductor device includes a plurality of circuit units 1*u*. A single circuit unit 1*u* includes one of the first circuit portion 100 and one of the second circuit portion 200 provided on the insulating substrate 10.

In each of the plurality of circuit units 1*u*, the direction of the current flowing in the first circuit portion 100 is opposite the direction of the current flowing in the second circuit portion 200. In the second variation of the first embodiment, the plurality of circuit units 1*u* is connected in parallel. For example, a positive voltage is applied to the interconnection pattern 20 and the interconnection pattern 40 of the plurality of circuit units 1*u*, and a negative voltage is applied to the interconnection pattern 22 and the interconnection pattern 42 of each of the circuit units 1*u*, from external wiring via terminals. As a result of this parallel connection, the parasitic inductance of the semiconductor device is reduced.

Second Embodiment

Figure 8:
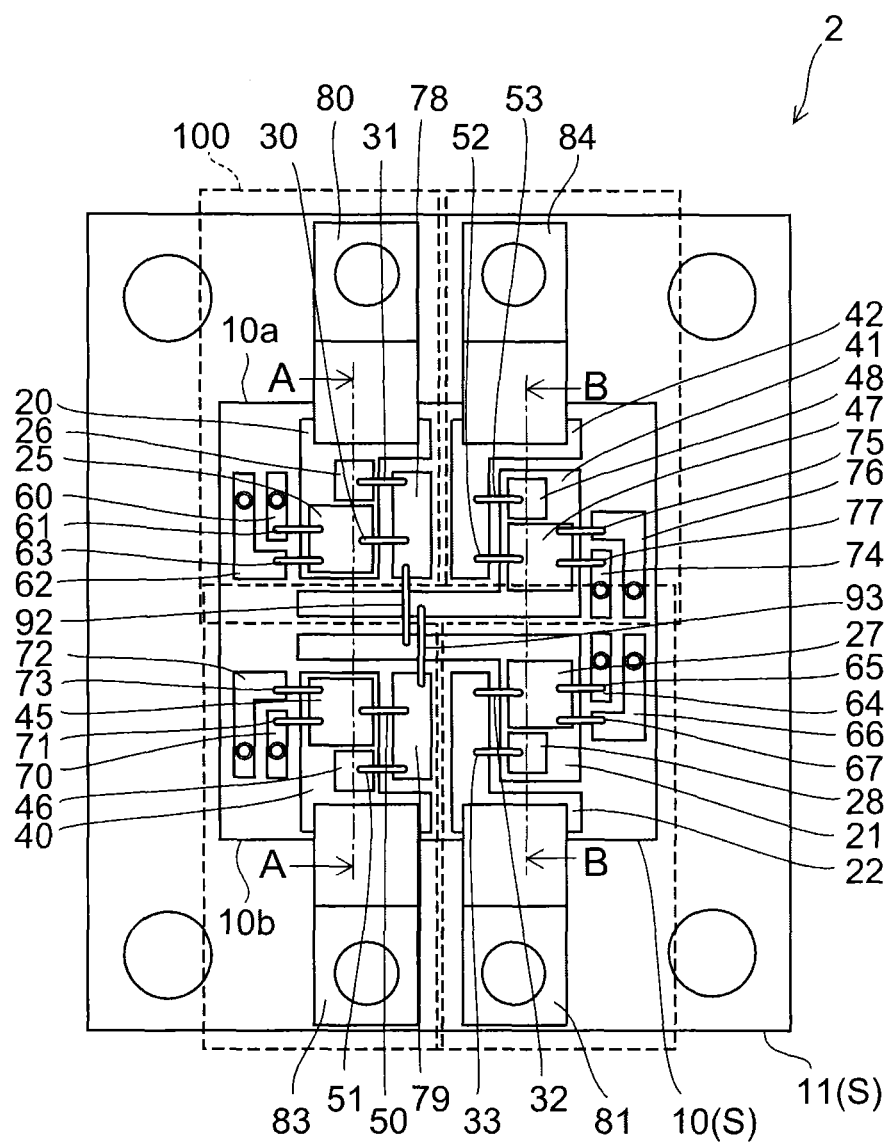
FIG. 8 is a schematic plan view of a semiconductor device according to a second embodiment.

FIG. 8 is a schematic plan view of a semiconductor device according to a second embodiment.

Figure 9:
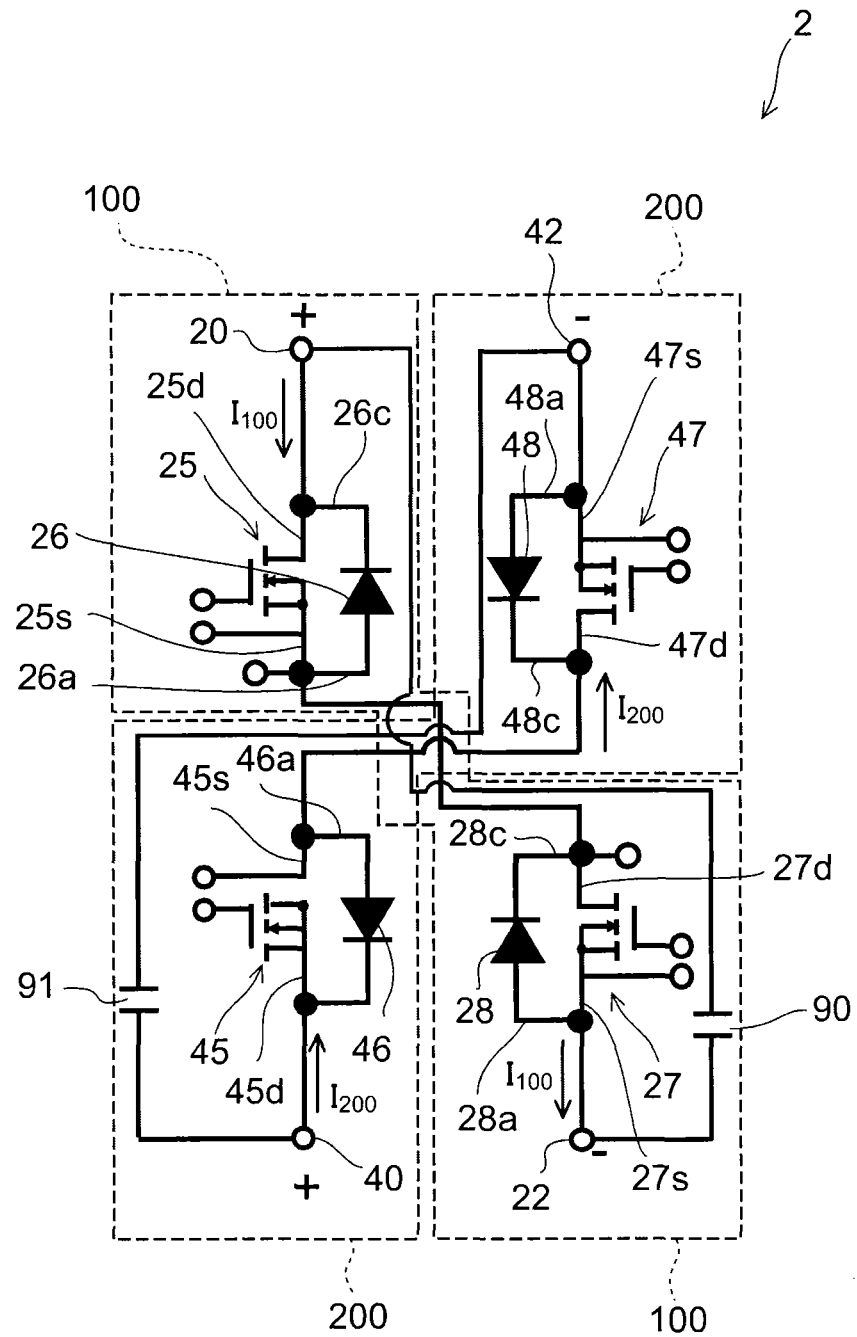
FIG. 9 is an equivalent circuit diagram of the semiconductor device according to the second embodiment.

FIG. 9 is an equivalent circuit diagram of the semiconductor device according to the second embodiment.

Figure 10:
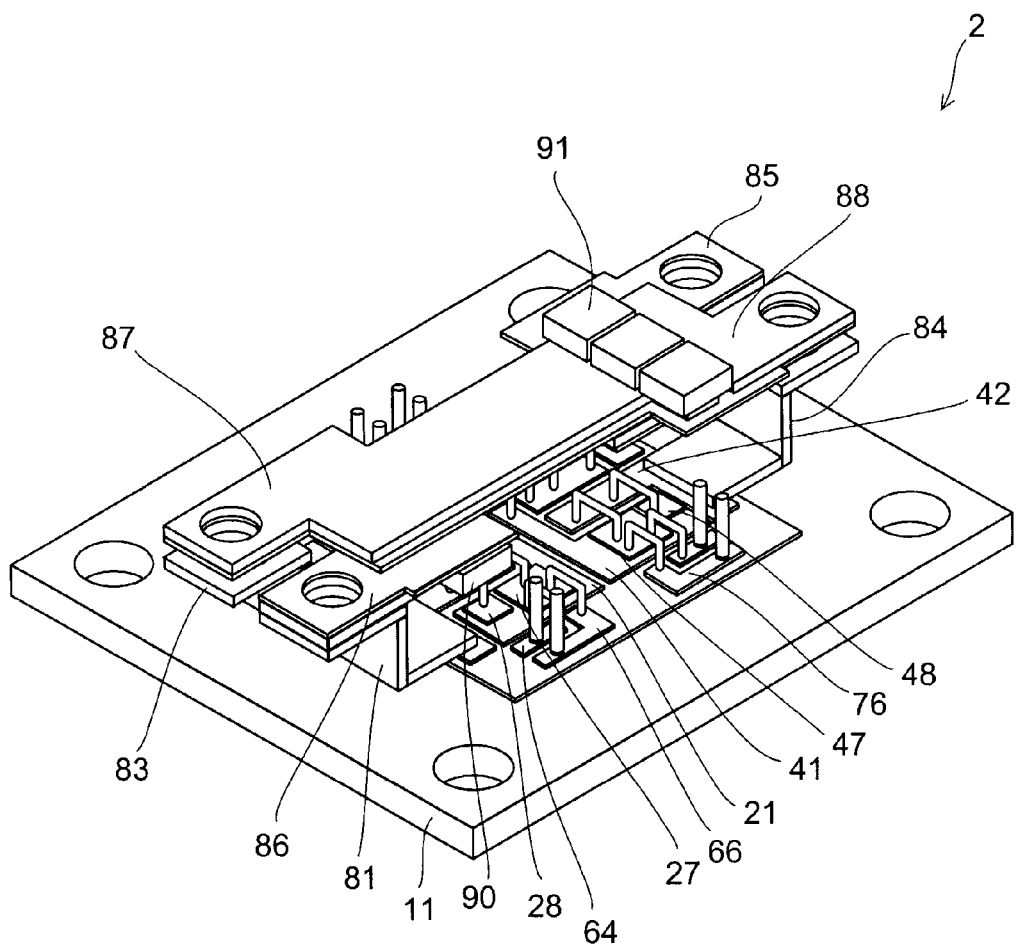
FIG. 10 and FIG. 11 are schematic perspective views of the semiconductor device according to the second embodiment.
Figure 11:
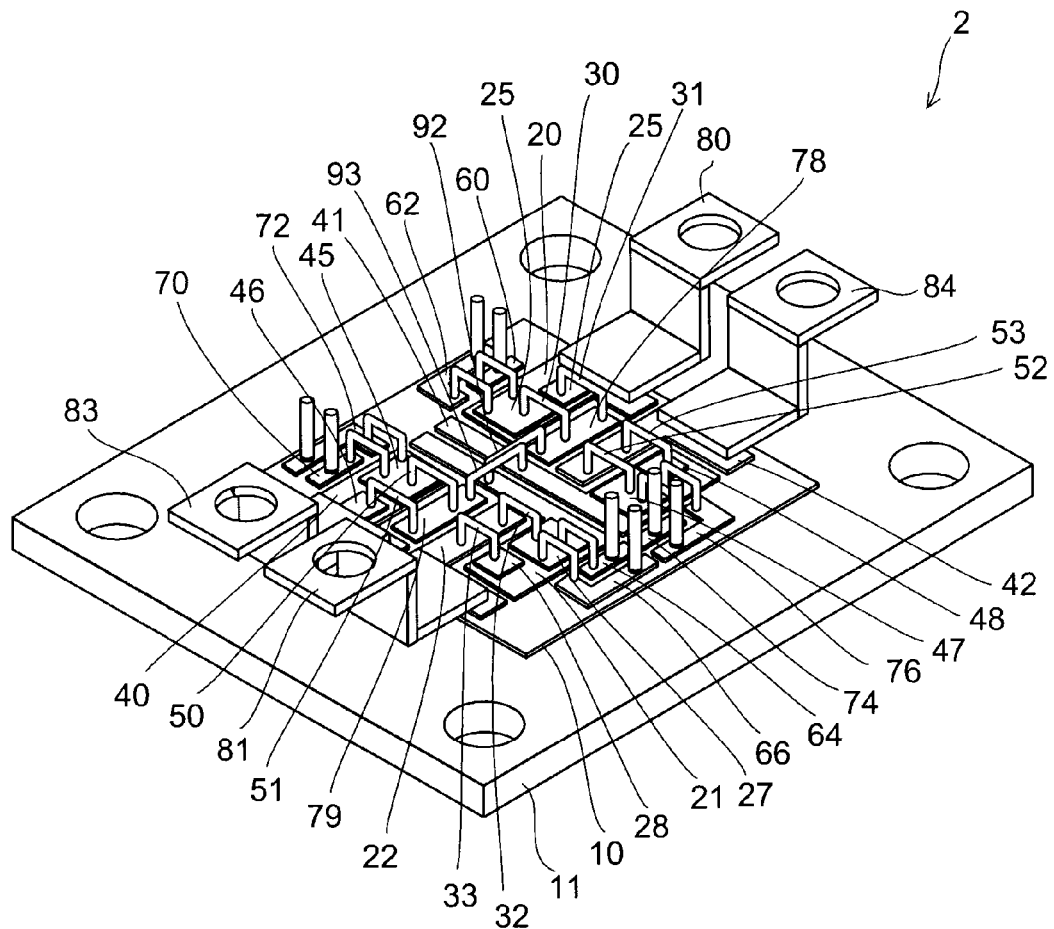

FIG. 10 and FIG. 11 are schematic perspective views of the semiconductor device according to the second embodiment.

FIG. 12 is a schematic cross-sectional view of the semiconductor device according to the second embodiment.

Figure 12A:
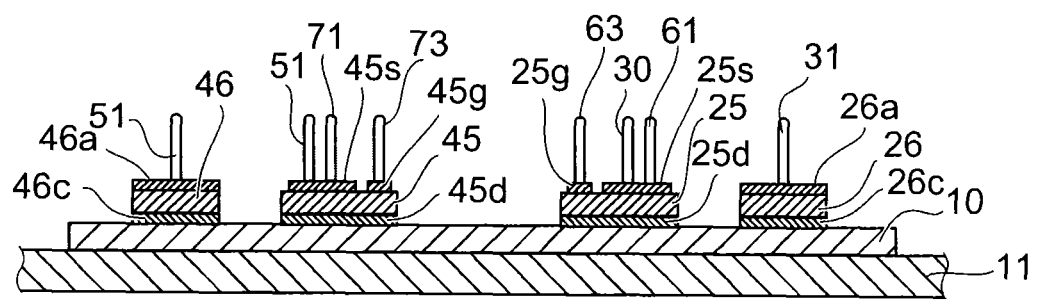
FIGS. 12A and 12B are schematic cross-sectional views of the semiconductor device according to the second embodiment.
Figure 12B:
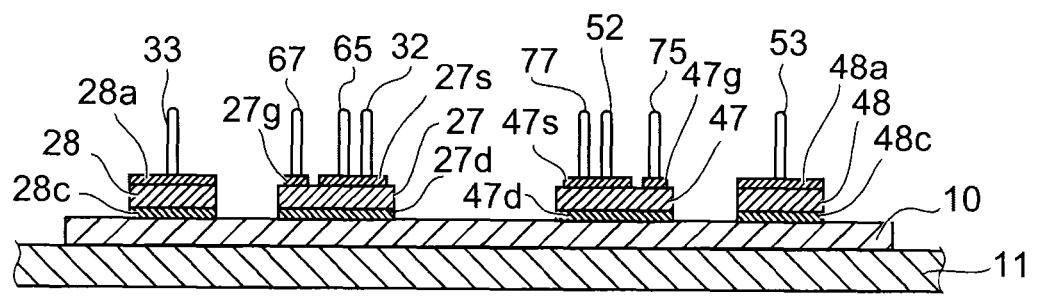

FIG. 12A illustrates a schematic cross-sectional view at a position along the line A-A in FIG. 8. FIG. 12B illustrates a schematic cross-sectional view at a position along the line B-B in FIG. 8.

In FIGS. 8, 9, and 11, the flat conductors 85 to 88, and the condensers 90, 91 illustrated in FIG. 10 are not illustrated.

A semiconductor device 2 according to the second embodiment includes, as an example, an inverter circuit. The semiconductor device 2 includes the first circuit portion 100 provided on the insulating substrate 10, and the second circuit portion 200 provided on the insulating substrate 10. A portion of the first circuit portion 100 intersects with a portion of the second circuit portion 200. The insulating substrate 10 is provided on the base body 11. The plan shape of the insulating substrate 10 is rectangular.

The first circuit portion 100 includes the interconnection pattern 20, the interconnection pattern 21, the interconnection pattern 22, the switching element 25 provided on the interconnection pattern 20, the diode 26 provided on the interconnection pattern 20, the switching element 27 provided on the interconnection pattern 21, and the diode 28 provided on the interconnection pattern 21.

The interconnection pattern 21 is disposed adjacent to the interconnection pattern 41. The interconnection pattern 22 is disposed adjacent to the interconnection pattern 21. The interconnection pattern 20, the interconnection pattern 21, and the interconnection pattern 22 are provided separated from each other.

As illustrated in FIGS. 9, 12A, and 12B, the drain electrode 25$d$ of the switching element 25 is connected to the interconnection pattern 20. The cathode electrode 26$c$ of the diode 26 is connected to the interconnection pattern 20. The drain electrode 27$d$ of the switching element 27 is connected to the interconnection pattern 21. The cathode electrode 28$c$ of the diode 28 is connected to the interconnection pattern 21.

In the semiconductor device 2, the source electrode 25$s$ of the switching element 25 is electrically connected to an interconnection pattern 78 via the interconnection 30. The interconnection pattern 78 is electrically connected to the interconnection pattern 21 via an interconnection 92. If the interconnection 30, the interconnection pattern 78, and the interconnection 92 are regarded as a single interconnection, then the source electrode 25$s$ of the switching element 25 is electrically connected to the interconnection pattern 21 via the interconnection.

The anode electrode 26$a$ of the diode 26 is electrically connected to the interconnection pattern 78 via the interconnection 31. If the interconnection 31, the interconnection pattern 78, and the interconnection 92 are regarded as a single interconnection, then the anode electrode 26$a$ of the diode 26 is electrically connected to the interconnection pattern 21 via the interconnection.

The source electrode 27$s$ of the switching element 27 is electrically connected to the interconnection pattern 22 via the interconnection 32. The anode electrode 28$a$ of the diode 28 is electrically connected to the interconnection pattern 22 via the interconnection 33.

The second circuit portion 200 includes the interconnection pattern 40, the interconnection pattern 41, the interconnection pattern 42, the switching element 45 provided on the interconnection pattern 40, the diode 46 provided on the interconnection pattern 40, the switching element 47 provided on the interconnection pattern 41, and the diode 48 provided on the interconnection pattern 41.

The interconnection pattern 41 is disposed adjacent to the interconnection pattern 40. The interconnection pattern 42 is disposed adjacent to the interconnection pattern 41. The interconnection pattern 40, the interconnection pattern 41, and the interconnection pattern 42 are provided separated from each other.

As illustrated in FIGS. 9, 12A, and 12B, the drain electrode 45$d$ of the switching element 45 is connected to the interconnection pattern 40. The cathode electrode 46$c$ of the diode 46 is connected to the interconnection pattern 40. The drain electrode 47$d$ of the switching element 47 is connected to the interconnection pattern 41. The cathode electrode 48$c$ of the diode 48 is connected to interconnection pattern 41.

In the semiconductor device 2, the source electrode 45$s$ of the switching element 45 is electrically connected to an interconnection pattern 79 via the interconnection 50. The interconnection pattern 79 is electrically connected to the interconnection pattern 41 via an interconnection 93. If the interconnection 50, the interconnection pattern 79, and the interconnection 93 are regarded as a single interconnection, then the source electrode 45$s$ of the switching element 45 is electrically connected to the interconnection pattern 41 via the interconnection.

The anode electrode 46$a$ of the diode 46 is electrically connected to the interconnection pattern 79 via an interconnection 51. If the interconnection 52, the interconnection pattern 79, and the interconnection 93 are regarded as a single interconnection, then the anode electrode 46$a$ of the diode 46 is electrically connected to the interconnection pattern 41 via the interconnection.

The source electrode 47$s$ of the switching element 47 is electrically connected to the interconnection pattern 42 via the interconnection 52. The anode electrode 48$a$ of the diode 48 is electrically connected to the interconnection pattern 42 via the interconnection 53.

The interconnection patterns 60, 62, 64, 66, 70, 72, 74, and 76 are provided on the insulating substrate 10.

The source electrode 25$s$ of the switching element 25 is electrically connected to the interconnection pattern 60 via the source interconnection 61. The gate electrode 25$g$ of the switching element 25 is electrically connected to the interconnection pattern 62 via the gate interconnection 63.

The source electrode 27$s$ of the switching element 27 is electrically connected to the interconnection pattern 64 via the source interconnection 65. The gate electrode 27$g$ of the switching element 27 is electrically connected to the interconnection pattern 66 via the gate interconnection 67.

The source electrode 45$s$ of the switching element 45 is electrically connected to the interconnection pattern 70 via the source interconnection 71. The gate electrode 45$g$ of the switching element 45 is electrically connected to the interconnection pattern 72 via the gate interconnection 73.

The source electrode 47$s$ of the switching element 47 is electrically connected to the interconnection pattern 76 via the source interconnection 75. The gate electrode 47$g$ of the switching element 47 is electrically connected to the interconnection pattern 74 via the gate interconnection 77.

The switching element 25 is disposed on the edge 10$a$ side of the insulating substrate 10, and the switching element 27 is disposed on the edge 10$b$ side of the insulating substrate 10. The switching element 45 is disposed on the edge 10$b$ side of the insulating substrate 10, and the switching element 47 is disposed on the edge 10$a$ side of the insulating substrate 10.

The diode 26 is disposed on the edge 10$a$ side of the insulating substrate 10, and the diode 28 is disposed on the edge 10$b$ side opposite the edge 10$a$ of the insulating substrate 10. The switching element 45 is disposed on the edge 10$b$ side of the insulating substrate 10, and switching element 47 is disposed on the edge 10$a$ side of the insulating substrate 10.

In the semiconductor device 2, the switching element 25 is aligned with the switching element 45 in the first direction along the substrate S. The switching element 25 is aligned with the switching element 47 in the second direction that intersects with the first direction along the substrate S. The switching element 27 is aligned with the switching element 47 in the first direction. The switching element 27 is aligned with the switching element 45 in the second direction.

In the semiconductor device 2, a gap between the switching element 25 and the switching element 45 is substantially equal to a gap between the switching element 27 and the switching element 47. Also, a gap between the switching element 25 and the switching element 47 is substantially equal to a gap between the switching element 27 and the switching element 45.

In the semiconductor device 2, a line connecting the center of the switching element 25 and the center of the switching element 27, and a line connecting the center of the switching element 45 and the switching element 47 intersect on the insulating substrate 10.

Also, the first circuit portion 100 includes the terminal 80 connected to the interconnection pattern 20, and the terminal 81 connected to the interconnection pattern 22. The first circuit portion 100 includes the flat conductor 85 connected to the terminal 80, and the flat conductor 86 connected to the terminal 81. The flat conductor 85 is electrically isolated from the flat conductor 86. The terminal 80 is disposed on the edge 10a side of the insulating substrate 10, and the terminal 81 is disposed on the edge 10b side of the insulating substrate 10.

The second circuit portion 200 includes the terminal 83 connected to the interconnection pattern 40, and the terminal 84 connected to the interconnection pattern 42. The second circuit portion 200 includes the flat conductor 87 connected to the terminal 83, and the flat conductor 88 connected to the terminal 84. The flat conductor 87 is electrically isolated from the flat conductor 88. The terminal 83 is disposed on the edge 10b side of the insulating substrate 10, and the terminal 84 is disposed on the edge 10a side of the insulating substrate 10.

FIG. 13 is a schematic view illustrating the second embodiment.

Figure 13A:
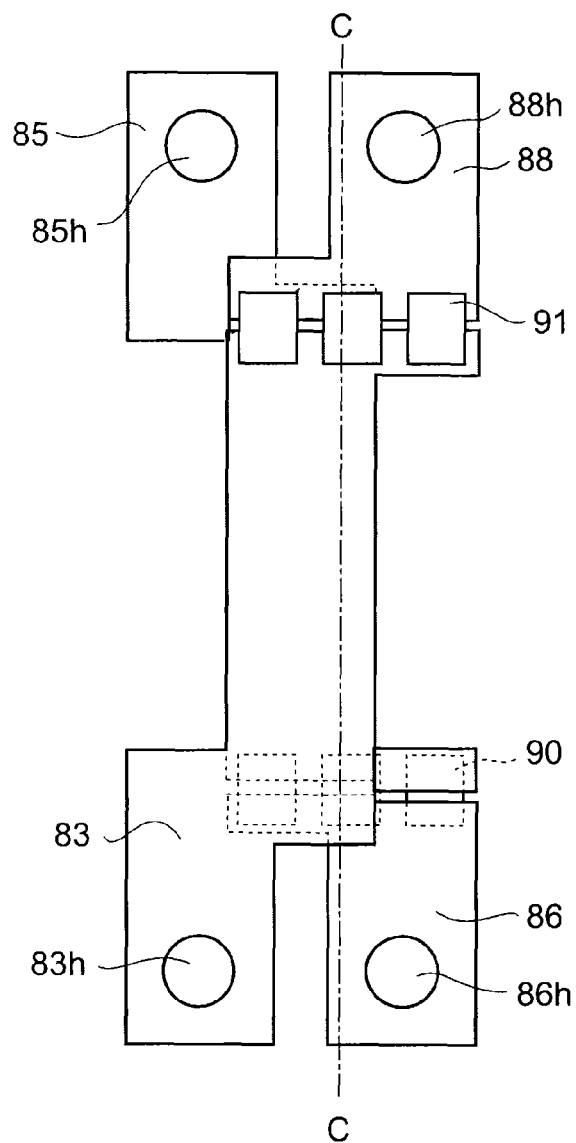
Figure 13B:
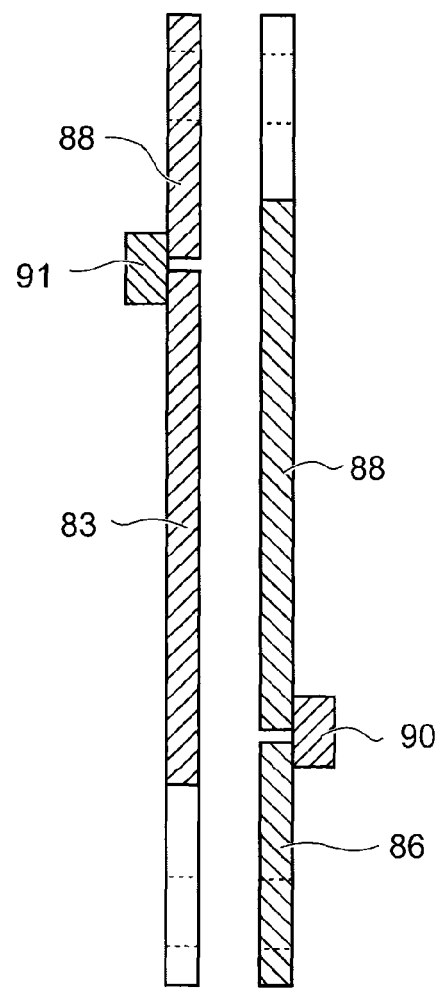

FIG. 13A is a schematic plan view illustrating a flat conductor. FIG. 13B is a schematic cross-sectional view illustrating the position along the line C-C in FIG. 13A.

In the second embodiment, a portion of the flat conductor 85 near a through hole 85h and a portion of the flat conductor 88 near a through hole 88h are juxtaposed on the base body 11. In a location other than this, a portion of the flat conductor 85 and a portion of the flat conductor 88 are overlapped. Also, a portion of the flat conductor 86 near a through hole 86h and a portion of the flat conductor 87 near a through hole 87h are juxtaposed on the base body 11. In a location other than this, a portion of the flat conductor 86 and a portion of the flat conductor 87 are overlapped. Also, the flat conductor 85 is connected to the flat conductor 86 via the condenser 90. The flat conductor 87 is connected to the flat conductor 88 via the condenser 91.

In other words, a portion of the structural body that includes the flat conductor 85, the condenser 90, and the flat conductor 86 intersects with a portion of the structural body that includes the flat conductor 87, the condenser 91, and the flat conductor 88.

In the semiconductor device 2, the first circuit portion 100 intersects with the second circuit portion 200. Also, in the semiconductor device 2, for example, a positive voltage is applied to the interconnection pattern 20 and the interconnection pattern 40. For example, a negative voltage is applied to the interconnection pattern 22 and the interconnection pattern 42.

Next, the operation of the semiconductor device 2 is described.

For example, in the semiconductor device 2, when a positive voltage is applied to the terminals 80, 83, and a negative voltage is applied to the terminals 81, 84 from external wiring, a positive voltage is applied to the interconnection pattern 20 and the interconnection pattern 40, and a negative voltage is applied to the interconnection pattern 22 and the interconnection pattern 42. Then, as a result of the operation of the switching elements 25, 27, 45, and 47, an alternating current voltage is generated between the interconnection pattern 21 and the interconnection pattern 41.

When these positive and negative voltages are applied to the semiconductor device 2, the direction of at least a portion of the current $I_{100}$ flowing in the circuit of the first circuit portion 100 is opposite the direction of at least a portion of the current $I_{200}$ flowing in the circuit of the second circuit portion 200 (FIG. 9). In other words, in the first circuit portion 100 and the second circuit portion 200 that intersect each other, the direction of the current flowing in each circuit is opposite each other.

In other words, the direction of the current flowing in the path of the terminal 80→the interconnection pattern 20→the switching element 25→the interconnection 30→the interconnection pattern 78→the interconnection 92→the interconnection pattern 21→the switching element 27→the interconnection 32→the interconnection pattern 22→the terminal 81 is different from the direction of the current flowing in the path of the terminal 83→the interconnection pattern 40→the switching element 45→the interconnection 50→the interconnection pattern 79→the interconnection 93→the interconnection pattern 41 the switching element 47→the interconnection 52→the interconnection pattern 42→the terminal 84.

For example, the direction of the current flowing in the terminal 80 is opposite the direction of the current flowing in the terminal 83. The direction of the current flowing in the interconnection pattern 20 is opposite the direction of the current flowing in the interconnection pattern 40. The direction of the current flowing in the interconnection pattern 22 is opposite the direction of the current flowing in the interconnection pattern 42. The direction of the current flowing in the terminal 81 is opposite the direction of the current flowing in the terminal 84.

Also, the direction of the current flowing in the path of the flat conductor 85→the condenser 90→the flat conductor 86 is opposite the direction of the current flowing in the path of the flat conductor 87→the condenser 91→the flat conductor 88.

Therefore, the direction of the magnetic flux generated in the first circuit portion 100 is opposite the direction of the magnetic flux generated in the second circuit portion 200. In this way, the magnetic flux generated in the first circuit portion 100 and the magnetic flux generated in the second circuit portion 200 act to cancel each other out.

Also, in the semiconductor device 2, a portion of the structural body that includes the flat conductor 85, the condenser 90, and the flat conductor 86, and a portion of the structural body that includes the flat conductor 87, the condenser 91, and the flat conductor 88 are overlapped. The direction of the magnetic flux generated in each of these structural bodies is opposite to each other. Therefore, the magnetic fluxes generated in these structural bodies act to efficiently cancel each other out.

In this way, the parasitic inductance generated within the semiconductor device 2 is reduced. Therefore, the induced voltage generated within the semiconductor device 2 is reduced. In addition, it is difficult to apply to the elements such as the switching elements, the diodes, and the like a voltage that exceeds their breakdown voltage. As a result, it is difficult for breakdown of an element to occur in the semiconductor device 2. Also, in the semiconductor device 2, the current flowing within the first circuit portion 100 and the current flowing within the second circuit portion 200 are proportional to each other.

Also, in the semiconductor device 2, the first circuit portion 100 and the second circuit portion 200 are provided on the insulating substrate 10. Therefore, there is no current flowing on the reverse side of the insulating substrate 10.

In this way, parasitic inductance is reduced in the semiconductor device 2, and the current flowing between circuit portions is in equilibrium, so a highly reliable semiconductor device is achieved.

(Variation of the Second Embodiment)

Figure 14:
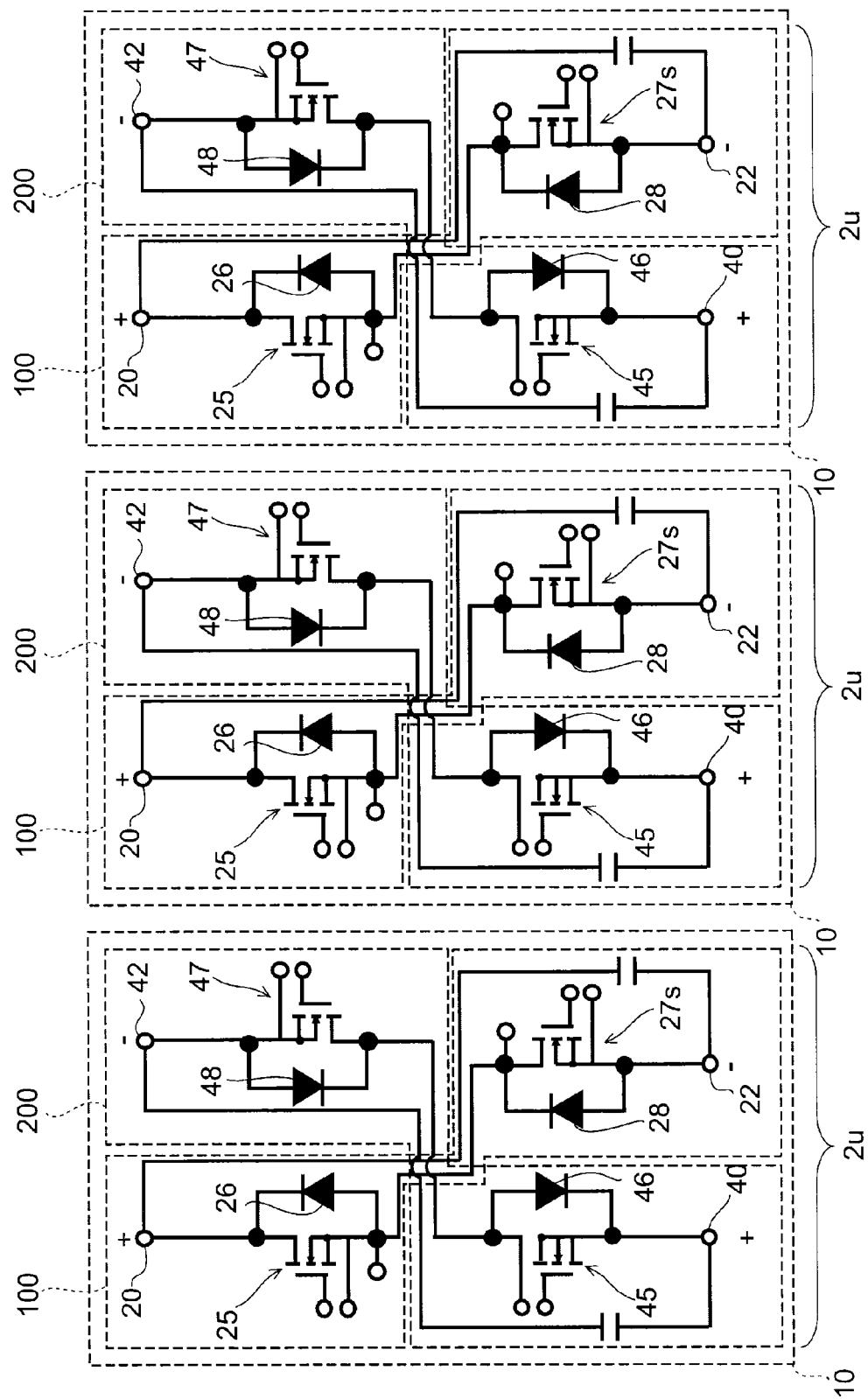
FIG. 14 is an equivalent circuit diagram of a variation of the second embodiment.

FIG. 14 is an equivalent circuit diagram of a variation of the second embodiment.

The number of first circuit portions 100 and the number of second circuit portions 200 are not necessarily limited to one each. In the variation of the second embodiment, the semiconductor device includes a plurality of circuit units 2u. A single circuit unit 2u includes one of the first circuit portion 100 and one of the second circuit portion 200 provided on the insulating substrate 10.

In each of the plurality of circuit units 2u, the direction of the current flowing in the first circuit portion 100 is opposite the direction of the current flowing in the second circuit portion 200. In this variation, the plurality of circuit units 2u is connected in parallel. For example, a positive voltage is applied to the interconnection pattern 20 and the interconnection pattern 40 in each of the plurality of circuit units 2u, and a negative voltage is applied to the interconnection pattern 22 and the interconnection pattern 42 in each of the plurality of circuit units 2u from external wiring via terminals. As a result of this parallel connection, the parasitic inductance of the semiconductor device is reduced.

As described above, according to the semiconductor device of the embodiment, it is possible to obtain high reliability.

The embodiments were described above with reference to specific examples. However, the embodiments are not limited to these specific examples. In other words, these examples to which a person skilled in the art to which the invention pertains has added design modifications as appropriate are also included in the scope of the invention, provided the features of the embodiments are included. Each of the elements included in the examples described above and their arrangement, material, conditions, shape, size, and so on is not limited to the examples described above, and can be varied as appropriate.

Also, each of the elements of each of the embodiments described above can be combined within the limits of technical possibility, and these combinations also are included within the scope of the embodiments, provided the features of the embodiments are included. Furthermore, regarding the scope of the spirit of the embodiments, it is understood that a variety of variations and modifications could be conceived by a person skilled in the art and that these variations and modifications all fall within the scope of the embodiments as well.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the invention.

What is claimed is:

1. A semiconductor device comprising:

a substrate;

a first circuit portion provided on the substrate, the first circuit portion including: a first switching element including a first electrode and a second electrode, a first diode including a first cathode electrode connected to the first electrode and a first anode electrode connected to the second electrode, a second switching element including a third electrode connected to the second electrode and a fourth electrode, and a second diode including a second cathode electrode connected to the third electrode and a second anode electrode connected to the fourth electrode; and a second circuit portion provided on the substrate, the second circuit portion including a third switching element including a fifth electrode and a sixth electrode, a third diode including a third cathode electrode connected to the fifth electrode and a third anode electrode connected to the sixth electrode, a fourth switching element including a seventh electrode connected to the sixth electrode and an eighth electrode, and a fourth diode including a fourth cathode electrode connected to the seventh electrode and a fourth anode electrode connected to the eighth electrode, the first switching element being juxtaposed with the second switching element in a first direction along the substrate, and being juxtaposed with the fourth switching element in a second direction that intersects with the first direction along the substrate, the third switching element being juxtaposed with the fourth switching element in the first direction, and being juxtaposed with the second switching element in the second direction, a direction from the first switching element toward the second switching element being opposite to a direction from the third switching element toward the fourth switching element, a voltage of a first polarity being applied to the first electrode and the fifth electrode, and a voltage of a second polarity opposite the first polarity being applied to the fourth electrode and the eighth electrode.

2. The semiconductor device according to claim 1, wherein the first circuit portion further includes:

a first conductor connected to each of the first electrode and the first cathode electrode, a second conductor provided separated from the first conductor, and connected to each of the third electrode and the second cathode electrode, a third conductor provided separated from the second conductor, a first interconnection electrically connecting the second electrode and the second conductor, a second interconnection electrically connecting the first anode electrode and the second conductor, a third interconnection electrically connecting the fourth electrode and the third conductor, and a fourth interconnection electrically connecting the second anode electrode and the third conductor, the second circuit portion further includes:

a fourth conductor connected to each of the fifth electrode and the third cathode electrode, a fifth conductor provided separated from the fourth conductor, and connected to each of the seventh electrode and the fourth cathode electrode, a sixth conductor provided separated from the fifth conductor,
a fifth interconnection electrically connecting the sixth electrode and the fifth conductor,
a sixth interconnection electrically connecting the third anode electrode and the fifth conductor,
a seventh interconnection electrically connecting the eighth electrode and the sixth conductor, and
an eighth interconnection electrically connecting the fourth anode electrode and the sixth conductor.

3. The semiconductor device according to claim 2, wherein the first circuit portion further includes:
a first terminal connected to the first conductor,
a second terminal connected to the third conductor,
a first flat conductor connected to the first terminal, and
a second flat conductor connected to the second terminal;
the second circuit portion further includes:
a third terminal connected to the fourth conductor,
a fourth terminal connected to the sixth conductor,
a third flat conductor connected to the third terminal, and
a fourth flat conductor connected to the fourth terminal, wherein
the first flat conductor is juxtaposed with the fourth flat conductor, and
the second flat conductor is juxtaposed with the third flat conductor.

4. The semiconductor device according to claim 3, wherein a portion of the first flat conductor and a portion of the fourth flat conductor are overlapped on the substrate, and
a portion of the second flat conductor and a portion of the third flat conductor are overlapped on the substrate.

5. The semiconductor device according to claim 3, further comprising:
a first condenser, and
a second condenser, wherein
the first flat conductor is connected to the second flat conductor via the first condenser, and
the third flat conductor is connected to the fourth flat conductor via the second condenser.

6. The semiconductor device according to claim 4, further comprising:
a first condenser, and
a second condenser, wherein
the first flat conductor is connected to the second flat conductor via the first condenser, and
the third flat conductor is connected to the fourth flat conductor via the second condenser.

7. The semiconductor device according to claim 1, wherein: a line connecting the center of the first switching element and the center of the third switching element, and a line connecting the center of the second switching element and the center of the fourth switching element intersect on the substrate.

8. The semiconductor device according to claim 1, wherein the direction of at least a portion of the current flowing in the circuit of the first circuit portion is opposite the direction of at least a portion of the current flowing in the circuit of the second circuit portion.

9. The semiconductor device according to claim 1, wherein: a gap between the first switching element and the second switching element is equal to a gap between the third switching element and the fourth switching element, and
a gap between the first switching element and the fourth switching element is equal to a gap between the second switching element and the third switching element.

10. The semiconductor device according to claim 1, comprising a plurality of circuit units, each circuit unit including a set of one of the first circuit portion and one of the second circuit portion, wherein
in each of the plurality of circuit units, the direction of the current flowing in the first circuit portion is opposite the direction of the current flowing in the second circuit portion.

11. A semiconductor device comprising:
a substrate;
a first circuit portion provided on the substrate, the first circuit portion including: a first switching element including a first electrode and a second electrode, a first diode including a first cathode electrode connected to the first electrode and a first anode electrode connected to the second electrode, a second switching element including a third electrode connected to the second electrode and a fourth electrode, and a second diode including a second cathode electrode connected to the third electrode and a second anode electrode connected to the fourth electrode; and
a second circuit portion provided on the substrate, the second circuit portion including a third switching element including a fifth electrode and a sixth electrode, a third diode including a third cathode electrode connected to the fifth electrode and a third anode electrode connected to the sixth electrode, a fourth switching element including a seventh electrode connected to the sixth electrode and an eighth electrode, and a fourth diode including a fourth cathode electrode connected to the seventh electrode and a fourth anode electrode connected to the eighth electrode,
the first switching element being juxtaposed with the third switching element in a first direction along the substrate, and being juxtaposed with the fourth switching element in a second direction that intersects with the first direction along the substrate,
the second switching element being juxtaposed with the fourth switching element in the first direction, and being juxtaposed with the third switching element in the second direction,
a voltage of a first polarity being applied to the first electrode and the fifth electrode, and
a voltage of a second polarity opposite the first polarity being applied to the fourth electrode and the eighth electrode.

12. The semiconductor device according to claim 11, wherein the first circuit portion further includes:
a first conductor connected to each of the first electrode and the first cathode electrode,
a second conductor provided separated from the first conductor, and connected to each of the third electrode and the second cathode electrode,
a third conductor provided separated from the second conductor
a first interconnection electrically connecting the second electrode and the second conductor,
a second interconnection electrically connecting the first anode electrode and the second conductor,
a third interconnection electrically connecting the fourth electrode and the third conductor, and
a fourth interconnection electrically connecting the second anode electrode and the third conductor,
and
the second circuit portion further includes:
a fourth conductor connected to each of the fifth electrode and the third cathode electrode, a fifth conductor provided separated from the fourth conductor, and connected to each of the seventh electrode and the fourth cathode electrode, a sixth conductor provided separated from the fifth conductor, a fifth interconnection electrically connecting the sixth electrode and the fifth conductor, a sixth interconnection electrically connecting the third anode electrode and the fifth conductor, a seventh interconnection electrically connecting the eighth electrode and the sixth conductor, and an eighth interconnection electrically connecting the fourth anode electrode and the sixth conductor.

13. The semiconductor device according to claim 12, wherein the first circuit portion further includes:

a first terminal connected to the first conductor, a second terminal connected to the third conductor, a first flat conductor connected to the first terminal, a second flat conductor connected to the second terminal, and the second circuit portion further includes:

a third terminal connected to the fourth conductor, a fourth terminal connected to the sixth conductor, a third flat conductor connected to the third terminal, and a fourth flat conductor connected to the fourth terminal, wherein a portion of the first flat conductor and a portion of the fourth flat conductor are overlapped, and a portion of the second flat conductor and a portion of the third flat conductor are overlapped.

14. The semiconductor device according to claim 13, further comprising:

a first condenser, and a second condenser, wherein the first flat conductor is connected to the second flat conductor via the first condenser, and the third flat conductor is connected to the fourth flat conductor via the second condenser.

15. The semiconductor device according to claim 11, wherein: a line connecting the center of the first switching element and the center of the second switching element, and a line connecting the center of the third switching element and the center of the fourth switching element intersect on the substrate.

16. The semiconductor device according to claim 11, wherein the first circuit portion and the second circuit portion intersect on the substrate.

17. The semiconductor device according to claim 11, wherein the direction of at least a portion of the current flowing in the circuit of the first circuit portion is opposite the direction of at least a portion of the current flowing in the circuit of the second circuit portion.

18. The semiconductor device according to claim 11, wherein: a gap between the first switching element and the third switching element is equal to a gap between the second switching element and the fourth switching element, and a gap between the first switching element and the fourth switching element is equal to a gap between the second switching element and the third switching element.

19. The semiconductor device according to claim 11, comprising a plurality of circuit units, each circuit unit including a set of one of the first circuit portion and one of the second circuit portion, wherein in each of the plurality of circuit units, the direction of the current flowing in the first circuit portion is opposite the direction of the current flowing in the second circuit portion.

20. The semiconductor device according to claim 11, wherein the first switching element, the second switching element, the third switching element, and the fourth switching element are provided on a common insulating substrate.

* * * * *